United States Patent
Glaser (10) Patent No.: US 7,576,611 B2
(45) Date of Patent: Aug. 18, 2009

(54) SYSTEMS AND METHODS FOR HIGH FREQUENCY ELECTRONIC POWER CONVERSION AND AMPLIFICATION

(75) Inventor: John Stanley Glaser, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 272 days.

(21) Appl. No.: 11/624,774

(22) Filed: Jan. 19, 2007

(65) Prior Publication Data

US 2008/0174370 A1    Jul. 24, 2008

(51) Int. Cl.
H03F 3/189    (2006.01)
H03F 3/68    (2006.01)

(52) U.S. Cl. ..................... 330/295; 330/125
(58) Field of Classification Search ............. 330/124 D, 330/125, 130, 200, 251, 295, 297, 124 R, 330/277, 286
See application file for complete search history.

(56) References Cited

U.S. PATENT DOCUMENTS

| | | | |
|---|---|---|---|
| 4,590,436 A * | 5/1986 | Butler et al. | 330/277 |
| 6,304,137 B1 * | 10/2001 | Pullen et al. | 330/10 |
| 6,600,376 B1 * | 7/2003 | Yang | 330/297 |
| 6,674,329 B1 * | 1/2004 | Stengel et al. | 330/286 |
| 7,075,371 B2 * | 7/2006 | Aoki et al. | 330/276 |

OTHER PUBLICATIONS

"JRL-2000F Fully Automatic MOSFET HF Linear Amplifier"; Japan Radio Co., Ltd, 1p, JRC, New York, New York, United States.

* cited by examiner

Primary Examiner—Gary L Laxton
(74) Attorney, Agent, or Firm—Penny A. Clarke (57) ABSTRACT

An electronic power amplifier includes a plurality of cells, each cell comprising a DC input port for accepting a DC input power from a voltage source $V_G$, an AC input port for accepting an AC signal S1 at a frequency $F_S$ and having a first magnitude $M_1$, a switching mechanism operatively coupled to the DC input port and to the AC input port for converting the DC input power to an AC output power at the frequency $F_S$ and having a second magnitude $M_2$ greater than the first magnitude $M_1$, and an output port capable of applying the AC output power to a load impedance. The plurality of cells includes at least a first cell having a first DC input port and a second cell having a second DC input port. The first and second DC input ports are connected in series for application to the voltage source $V_G$.

29 Claims, 7 Drawing Sheets

SYSTEMS AND METHODS FOR HIGH FREQUENCY ELECTRONIC POWER CONVERSION AND AMPLIFICATION

STATEMENT REGARDING FEDERALLY SPONSORED RESEARCH AND DEVELOPMENT

The U.S. Government may have certain rights in this invention pursuant to contract number FA8650-05-C-7201 awarded by the Defense Advanced Research Projects Agency (DARPA) of the Department of Defense (DoD).

FIELD OF INVENTION

The present disclosure relates generally to electronic power conversion and amplification, and more particularly, to systems and methods for providing high frequency power conversion and amplification.

BACKGROUND

Two design objectives for electronic power amplifier circuits are high efficiency and high power density. RF amplifiers of a type known as switching amplifiers provide both high efficiency and high power density by operating an active electronic device, such as a transistor, as a switch that is either fully on or fully off. Unfortunately, switching loss also increases as a function of switching frequency, resulting in lost power. Switching loss is attributable to practical limitations in the semiconductor devices that are used as switching elements in power conversion circuits. These limitations include non-zero switching time and non-zero device capacitance.

Soft switching amplifier circuits have been used in applications where high frequency power switching is required in conjunction with low power loss. As a practical matter, the power and frequency range of soft switching circuits is limited by the parasitic reactive impedances of semiconductor-based switching elements. In particular, in some classes of switching conversion circuit topologies, the aforementioned parasitic reactive impedances set a lower limit on power throughput for a given switching frequency and an upper limit on switching frequency for a given power level. Some of the topologies subject to this limitation include Class E, Class F, Class Φ, and their duals, inverses, and other derivative circuits. Unfortunately, this lower limit may be higher than the maximum power desired, or the frequency may be lower than desired, with the effect that it is not possible to simultaneously achieve high efficiency and high power density.

Figure 1:
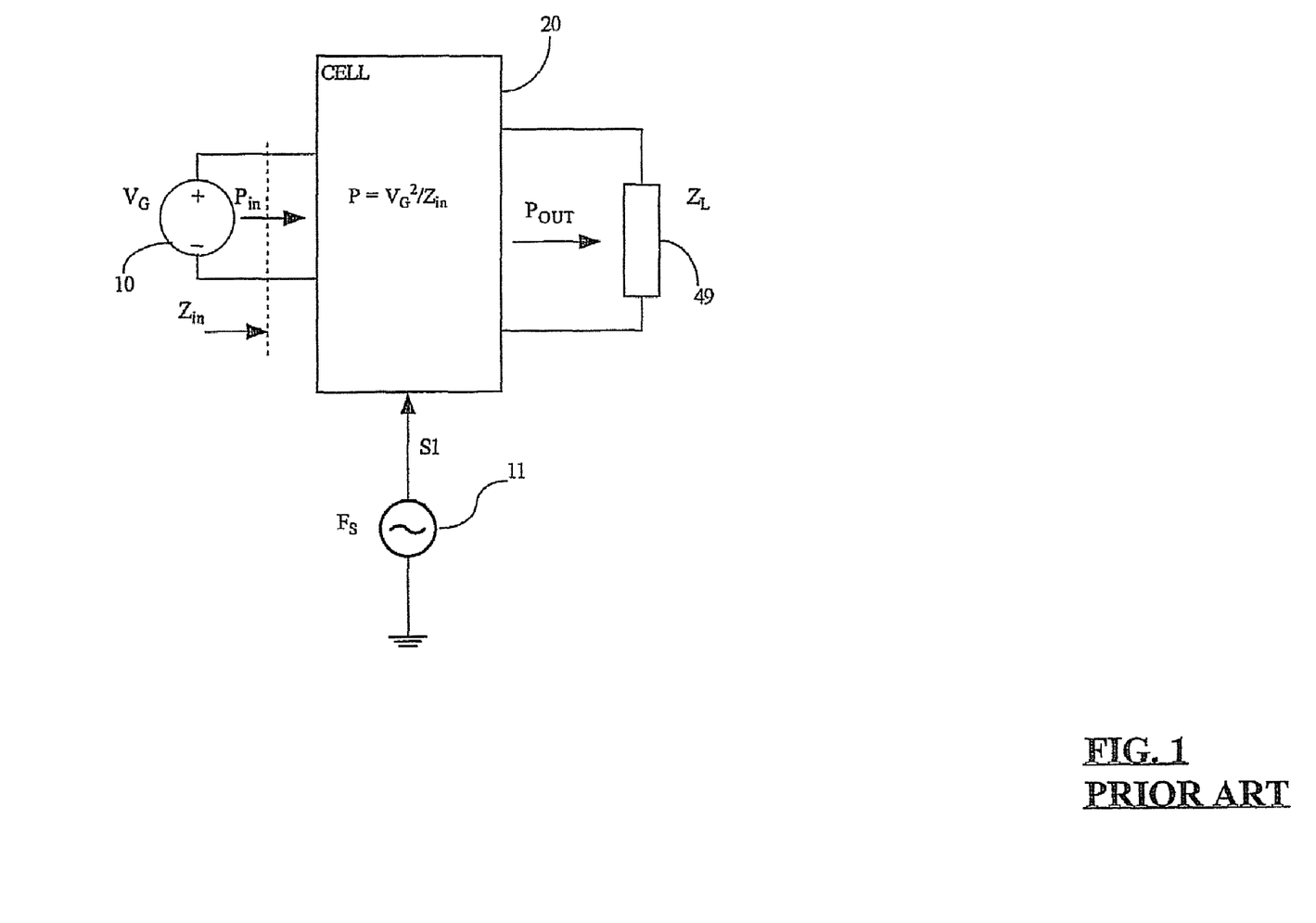
FIG. 1 is a generalized block diagram showing a prior art high frequency electronic power amplifier cell.

FIG. 1 is a block diagram showing a simplified prior art high frequency amplifier cell 20. Cell 20 accepts an input from a DC voltage source $V_G$ 10 supplying an input power $P_{IN}$. The input impedance of cell 20 is $Z_{IN}$. An AC signal S1 is produced by an AC signal source 11. Signal S1 has a frequency $F_S$ for controlling the modulation of the input power $P_{IN}$. Typically, signal S1 is a low power signal. In response to signal S1, cell 20 provides an AC output signal $P_{OUT}$ of much higher power than S1 to a load impedance $Z_L$ 49. Assuming that cell 20 is implemented using low-loss elements, $P_{IN}=P_{OUT}=P$ is a close approximation, where $P=(V_G^2)/Z_{IN}$.

Figure 2:
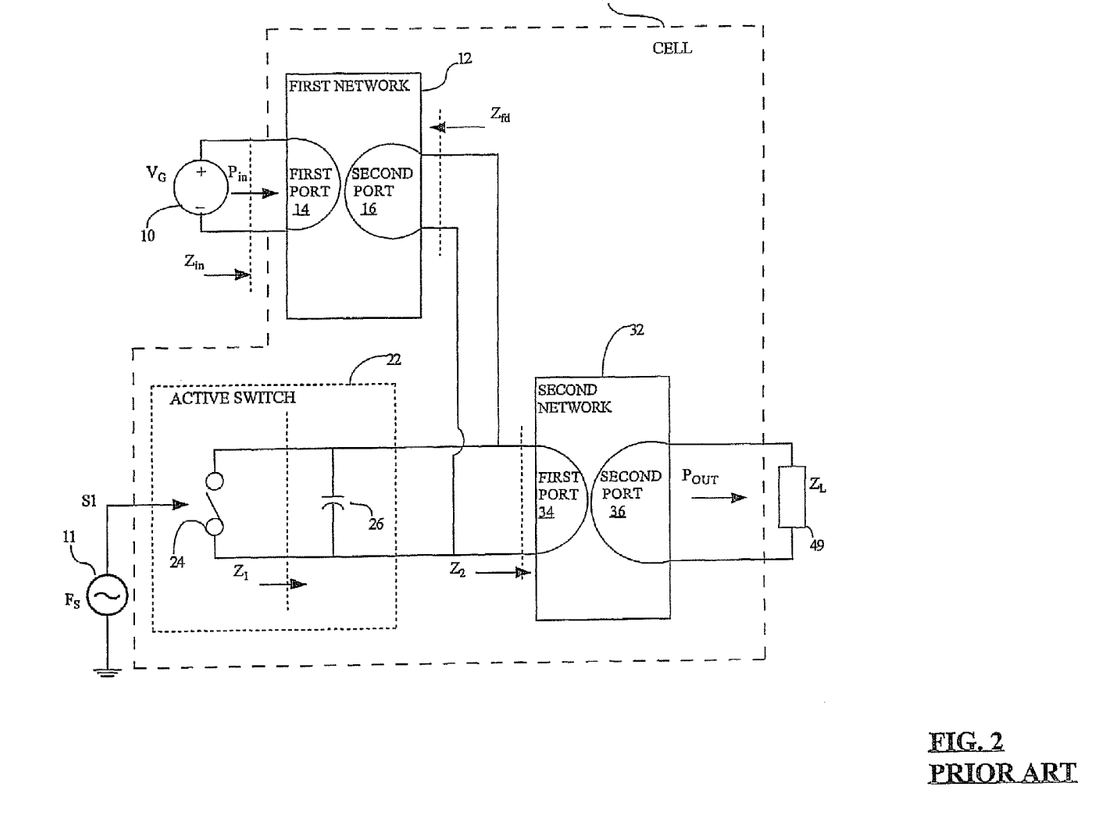
FIG. 2 is a detailed block diagram of the prior art high frequency electronic power amplifier cell shown in FIG. 2.

FIG. 2 is a more detailed block diagram of the prior art high frequency resonant power amplifier cell shown in FIG. 2. Cell 20 includes a first network 12, a second network 32, and an active switch 22. Active switch 22 is controlled by an AC signal S1 produced by an AC signal source 11. Signal S1 has a frequency $F_S$. First network 12 has a first port 14 and a second port 16. Second network 32 has a first port 34 and a second port 36. First port 14 of first network 12 is operatively coupled to voltage source $V_G$ 10, and second port 36 of second network 32 is operatively coupled to load impedance $Z_L$ 49. Second port 16 of first network 12 is operatively coupled to first port 34 of second network 32. First network 12 functions as a DC feed network, feeding a DC voltage from voltage source $V_G$ 10 to second network 32. Second network 32 functions as an impedance matching network for matching the impedance of first network 12 and active switch 22 to load impedance $Z_L$ 49. Illustratively, first network 12 is implemented as a low-loss network of circuit elements for interfacing $V_G$ 10 with second network 32 and active switch 22 so as to permit soft switching of active switch 22. Illustratively, second network 32 is implemented as a low-loss impedance matching network of circuit elements selected so as to permit soft switching of active switch 22. In practice, it is sometimes possible to have the functions of networks 12 and 32 provided by a single network.

Active switch 22 is operatively coupled in shunt across second port 16 and first port 34. Active switch 22 includes a switching mechanism 24 which is turned on and off at input switching frequency $F_S$ provided by input signal S1. Switching mechanism 24 provides an inherent parasitic capacitance $C_1$ represented schematically by a capacitor 26. More specifically, capacitor 26 is not present as a separate element, but rather exists as an integral part of active switch 22 along with switching mechanism 24. Typically, capacitor 26 represents the inherent parasitic output capacitance ($C_1$) of a semiconductor device used to implement active switch 22. Illustratively, active switch 22 is implemented using a soft switching circuit capable of high frequency operation, such as a Class E circuit. Class E circuits utilize a soft switching technique termed zero-voltage switching (ZVS) to operate a semiconductor-based main power switch at near zero switching voltage for both turn-on and turn-off, resulting in very low switching losses. Other circuit classes such as F, Φ, and their derivatives are also capable of such operation.

If soft switching is to occur, the impedance $Z_1$ of active switch mechanism 22 should fall within a predetermined range. $Z_1$ is defined by a parallel combination of first port 34 of second network 32, second port 16 of first network 12, and the parasitic capacitance $C_1$ of active switch 22 as represented by capacitor 26. If too much parasitic capacitance $C_1$ is present, the maximum allowable switching frequency $F_S$ for a given power $P_{OUT}$ is too low to achieve a desired power density while still maintaining soft switching. Under these circumstances, the existence of parasitic capacitance $C_1$ across active switch 22 will not permit ZVS operation. More specifically, for a product of capacitance $C_1$ and desired switching frequency $F_S$, there is a lower limit $P_{min}$ on power throughput below which ZVS operation cannot be achieved. This lower limit is expressed mathematically as $P_{min}=KV^2*(F_S)*(C_1)$ where K is a constant based upon the circuit topology of the power conversion circuit. As a practical matter, capacitance $C_1$ can never be lower than the parasitic output capacitance of the device used to implement active switch 22, and this value of $C_1$ thus defines lower limit $P_{min}$.

If the required power throughput for a given system application is lower than lower limit $P_{min}$, it is possible to reduce $P_{min}$ by lowering the switching frequency $F_S$, or by not utilizing soft switching, but neither of these options may represent acceptable choices. Moreover, while there are a number of presently existing ZVS circuits which provide alternatives to Class E designs, such alternatives are nonetheless also limited in terms of the lowest achievable power throughput. These alternative circuits require additional components that may reduce efficiency and power density, such that the goals of high efficiency and high power density may not be achieved simultaneously.

In some cases, it may be possible to reduce lower limit $P_{min}$ by the addition of a shunt inductive reactance in parallel with active switch 22 and capacitor 26. The inductive reactance cancels all or some of the parasitic capacitance $C_1$ at one frequency, thus permitting switching frequency $F_S$ to be increased. Accordingly, if cancellation of some or all of the capacitive reactance of capacitor 26 is desired, this may be accomplished by designing at least one of first network 12 or second network 32 to provide an appropriate inductive reactance.

There are practical difficulties associated with using an inductive reactance in a switching power conversion circuit so as to permit active switching. First, the amount of capacitive reactance that can be cancelled is an increasing function of the quality factor Q of the inductor or network used to provide the inductive reactance. Since realizable inductors have finite values of Q, only a finite amount of capacitive reactance can be cancelled. Second, the sensitivity of the resonant network formed by the parallel inductance in shunt with the parasitic output capacitance of the main power switch is an increasing function of the amount of capacitive reactance to be cancelled. Thus, as more capacitance is cancelled, the permissible variation in component values becomes smaller, and implementation becomes more difficult.

Parasitic capacitance $C_1$ sets a lower limit on power throughput and an upper limit on switching frequency. In practice, the lower limit may be higher than the maximum power desired, or the switching frequency may be lower than desired, with the effect that it is not possible to simultaneously achieve high efficiency and high power density. What is needed, therefore, is a switching power amplifier circuit capable of simultaneously providing high power density and high efficiency.

It is well known that a high frequency amplifier can be used a part of a DC/DC converter, adding a rectifier onto the output of the amplifier to convert the AC output signal to a DC output signal of approximately the same power but having a voltage and a current that may be different than the input DC voltage and current. In particular, the use of switching amplifiers such as Class E, Class F, Class Φ, and their duals, inverses, and other derivative circuits allow a high-efficiency, high density DC/DC converter to be constructed. Accordingly, the background presented thus far also applies to DC/DC converters.

BRIEF SUMMARY

In accordance with exemplary embodiments, systems and methods for providing electronic power conversion are disclosed.

Pursuant to illustrative embodiments, an electronic power amplifier includes a plurality of cells, each cell comprising a DC input port for accepting a DC input power from a voltage source $V_G$, an AC input port for accepting an AC signal S1 at a frequency $F_S$ and having a first magnitude $M_1$, a switching mechanism operatively coupled to the DC input port and to the AC input port for converting the DC input power to an AC output power at the frequency $F_S$ and having a second magnitude $M_2$ greater than the first magnitude $M_1$, and an output port capable of applying the AC output power to a load impedance. The plurality of cells includes at least a first cell having a first DC input port and a second cell having a second DC input port. The first and second DC input ports are connected in series for application to the voltage source $V_G$.

Pursuant to illustrative embodiments, a method of amplifying an AC input signal of frequency $F_S$ uses a plurality of cells, each cell comprising a DC input port for accepting a DC input power from a voltage source $V_G$, an AC input port for accepting an AC signal S1 at a frequency $F_S$ and having a first magnitude $M_1$, a switching mechanism operatively coupled to the DC input port and to the AC input port for converting the DC input power to an AC output power at the frequency $F_S$ and having a second magnitude $M_2$ greater than the first magnitude $M_1$, and an output port capable of applying the AC output power to a load impedance. The plurality of cells includes at least a first cell having a first DC input port and a second cell having a second DC input port. The method comprises connecting the first and second DC input ports in series, and applying the voltage source $V_G$ in series with the series-connected first and second DC input ports.

BRIEF DESCRIPTION OF THE DRAWINGS

Referring to the exemplary drawings wherein like elements are numbered alike in the accompanying FIGURES.

DETAILED DESCRIPTION OF THE EXEMPLARY EMBODIMENTS

Figure 3:
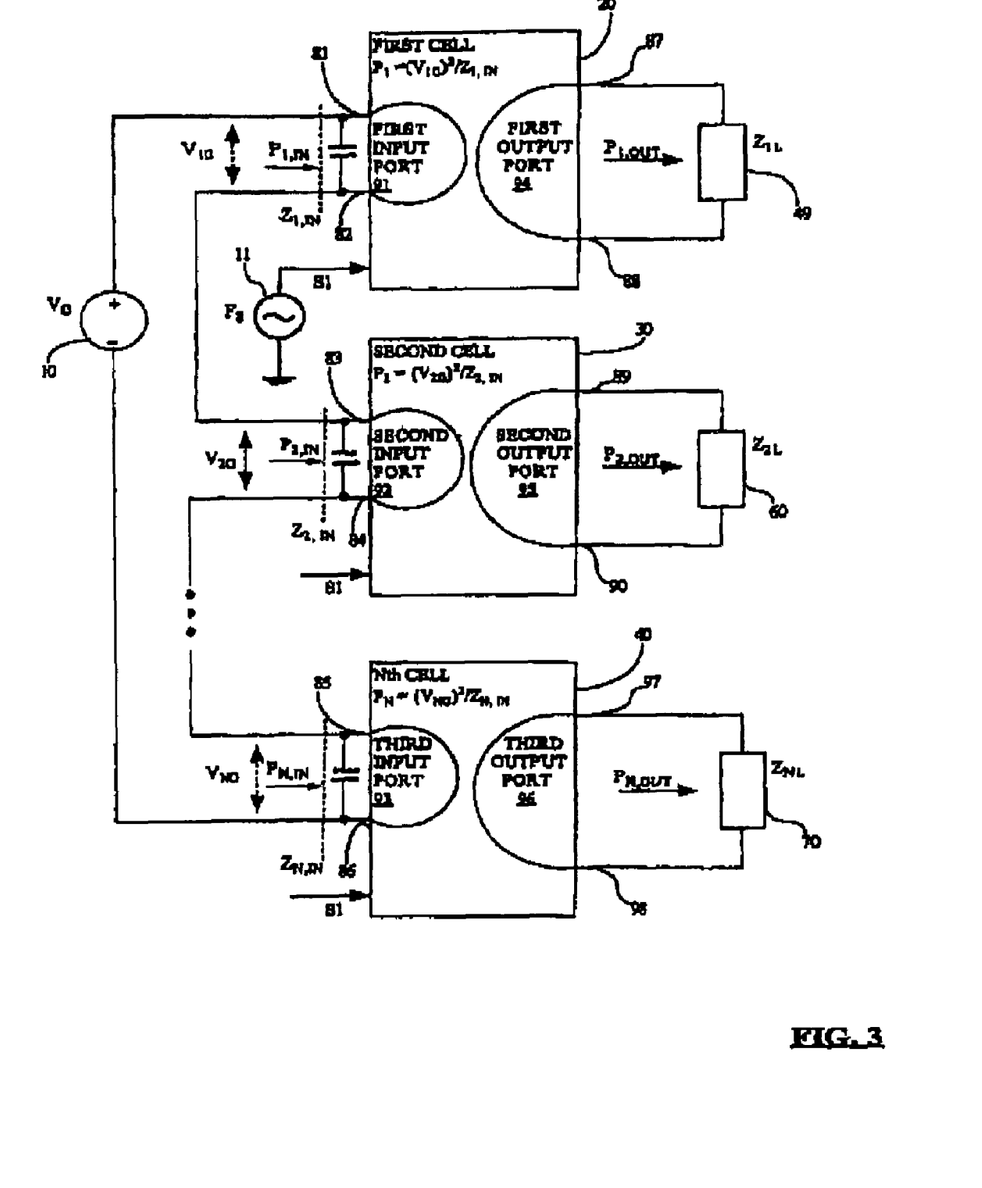
FIG. 3 is a block diagram of an electronic power amplifier constructed in accordance with a first set of illustrative embodiments.

FIG. 3 is a block diagram of an electronic power amplifier constructed in accordance with a first set of illustrative embodiments. The electronic power amplifier includes a plurality of cells, illustratively shown as a first cell 20, a second cell 30, and an Nth cell 40. Each cell 20, 30, 40 may, but need not, be implemented as shown in FIGS. 1 and 2. A voltage source $V_G$ 10 is implemented using any source of DC voltage. A first input port 91, a second input port 92, an Nth input port 93, and voltage source $V_G$ 10 are all connected in series such that a terminal 81 of first input port 91 is connected to voltage source $V_G$ 10, a terminal 82 of first input port 91 is connected to a terminal 83 of second input port 92, a terminal 84 of second input port 92 is connected to a terminal 85 of Nth input port 93, and a terminal 86 of Nth input port 93 is connected to voltage source $V_G$ 10. In this series configuration, voltage source $V_G$ 10 generates a voltage $V_{1G}$ across first input port 91, a voltage $V_{2G}$ across second input port 92, and a voltage $V_{NG}$ across Nth input port 93. An AC input signal S1 at a frequency $F_S$ and having a first magnitude $M_1$ is produced by an AC signal source 11. Signal S1 is provided to all cells 20, 30, 40 substantially simultaneously.

First input port 91 has an input impedance of $Z_{1,IN}$, second input port 92 has an input impedance of $Z_{2,IN}$, and Nth input port 93 has an input impedance of $Z_{N,IN}$. First cell 20 accepts a first input power $P_{1,IN}$ resulting from application of $V_{1G}$ to impedance $Z_{1,IN}$, and converts the first input power to a first output power $P_{1,OUT}$ delivered across a first load impedance 49. First load impedance 49 has an impedance of $Z_{1L}$ and is connected to a pair of terminals 87, 88 of a first output port 94. Similarly, second cell 30 accepts a second input power $P_{2,IN}$ resulting from application of $V_{2G}$ to impedance $Z_{2,IN}$, and converts the second input power to a second output power $P_{2,OUT}$ delivered across a second load impedance 60. Second load impedance 60 has an impedance of $Z_{2L}$ and is connected to a pair of terminals 89, 90 of a second output port 95. Likewise, Nth cell 40 accepts an Nth input power $P_{N,IN}$ resulting from application of $V_{NG}$ to impedance $Z_{N,IN}$, and converts the Nth input power to an Nth output power $P_{N,OUT}$ delivered across an Nth load impedance 70. Nth load impedance 70 has an impedance of $Z_{NL}$ and is connected to a pair of terminals 97, 98 of an Nth output port 96.

$P_{1,OUT}$ represents the power throughput of first cell 20, $P_{2,OUT}$ represents the power throughput of second cell 30, and $P_{N,OUT}$ represents the power throughput of Nth cell 40. Power throughput $P_{1,OUT}$ for first cell 20 is a function of input voltage $V_{1G}$, switching frequency $F_S$, and input impedance $Z_{1,IN}$ at switching frequency $F_S$. Input impedance $Z_{1,IN}$ is an aggregate network impedance that is a function of all the individual impedances of the components used to construct first cell 20 and load impedance $Z_{1L}$. From a practical standpoint, it may be assumed that first cell 20 is constructed using low-loss, linear, time-invariant components. Accordingly, power throughput $P_{1,OUT}$ for first cell 20 can be calculated as $P_{1,OUT}=(V_{1G}^2)/Z_{1,IN}$. Similarly, power throughput $P_{2,OUT}$ for second cell 30 can be calculated as $P_{2,OUT}=(V_{2G}^2)/Z_{2,IN}$, and power throughput $P_{N,OUT}$ for Nth cell 40 can be calculated as $P_{N,OUT}=(V_{NG}^2)/Z_{N,IN}$. Total power throughput is calculated as $$P_T = P_{1,OUT} + P_{2,OUT} + \ldots + P_{N,OUT} = \sum_{n=1}^{N} P_{n,OUT} = \sum_{n=1}^{N} \frac{V_{n,G}^2}{Z_{n,IN}}.$$

This total power throughput is an AC output power at the frequency $F_S$ and having a second magnitude $M_2$ greater than the first magnitude $M_1$. Total input impedance $Z_{IN}$ seen by voltage source $V_G$ 10 due to the above-described series combination of first cell 20, second cell 30, and Nth cell 40 is calculated as $$Z_{IN} = Z_{1,IN} + Z_{2,IN} + \ldots + Z_{N,IN} = \sum_{n=1}^{N} Z_{n,IN}$$

In the illustrative configuration of FIG. 3, power conversion is divided among a plurality (N) of cells including first cell 20, second cell 30, and Nth cell 40. First cell 20, second cell 30, and Nth cell 40 could, but need not, be implemented using substantially identical cells. However, for explanatory purposes, it will first be assumed that first cell 20, second cell 30, and Nth cell 40 are substantially identical, with the effect that a total load impedance $Z_L$ is divided equally among $Z_{1L}$, $Z_{2L}$, and $Z_{NL}$. Each cell 20, 30, 40 carries a power $P'=P_T/N$ with an input voltage $V_G'=V_G/N$, where N is the number of cells to be utilized. Each cell has an input impedance $Z_{IN}'=Z_{IN}/N$. This impedance relationship implies that the impedances of the components used to implement cells 20, 30, and 40 can be multiplied by a factor of 1/N relative to the prior art single-cell configuration of FIGS. 1 and 2. Accordingly, if a fixed $F_S$ is employed, the inductors used in cells 20, 30, and 40 (FIG. 3) may be scaled by a factor of 1/N. Also, the parasitic capacitances of any switching devices used in cells 20, 30, and 40, such as active switch 22 (FIG. 2), may be scaled by a factor of N.

Scaling the capacitors of cells 20, 30, and 40 (FIG. 3) by a factor of N enables an active switching device having an inherent parasitic capacitance $C1'=(N)*(C1)$ to be employed in each of cells 20, 30, and 40, where C1 represents the inherent parasitic capacitance of a single-cell electronic power amplifier processing power $P_T$. (see FIGS. 1 and 2). Thus, the configuration of FIG. 3 enables switching devices to be used in power converters even if these switching devices provide too much inherent parasitic capacitance for use in the circuits of FIGS. 1 and 2. Alternatively or additionally, a given electronic power amplifier can now utilize active switching devices with larger inherent parasitic capacitances. In many situations, using active switching devices with large parasitic capacitances results in lower conduction losses.

Next, consider a scenario where the inherent parasitic capacitances C1' of the active switching devices used in cells 20, 30, and 40 (FIG. 3) are fixed. In this case, $F_S$ can be increased by a factor of N to achieve the required impedance that compensates for the parasitic capacitances C1' provided by the active switching devices. For proper scaling of all impedances, the inductors used in cells 20, 30, and 40 should be scaled by a factor of $1/(N^2)$. This scaling factor may greatly reduce the size of the inductors, with a corresponding benefit of improved power density. Moreover, it is also possible to trade off increases in $F_S$ with increases in C1 to achieve a desired optimization for a given system application.

Figure 4:
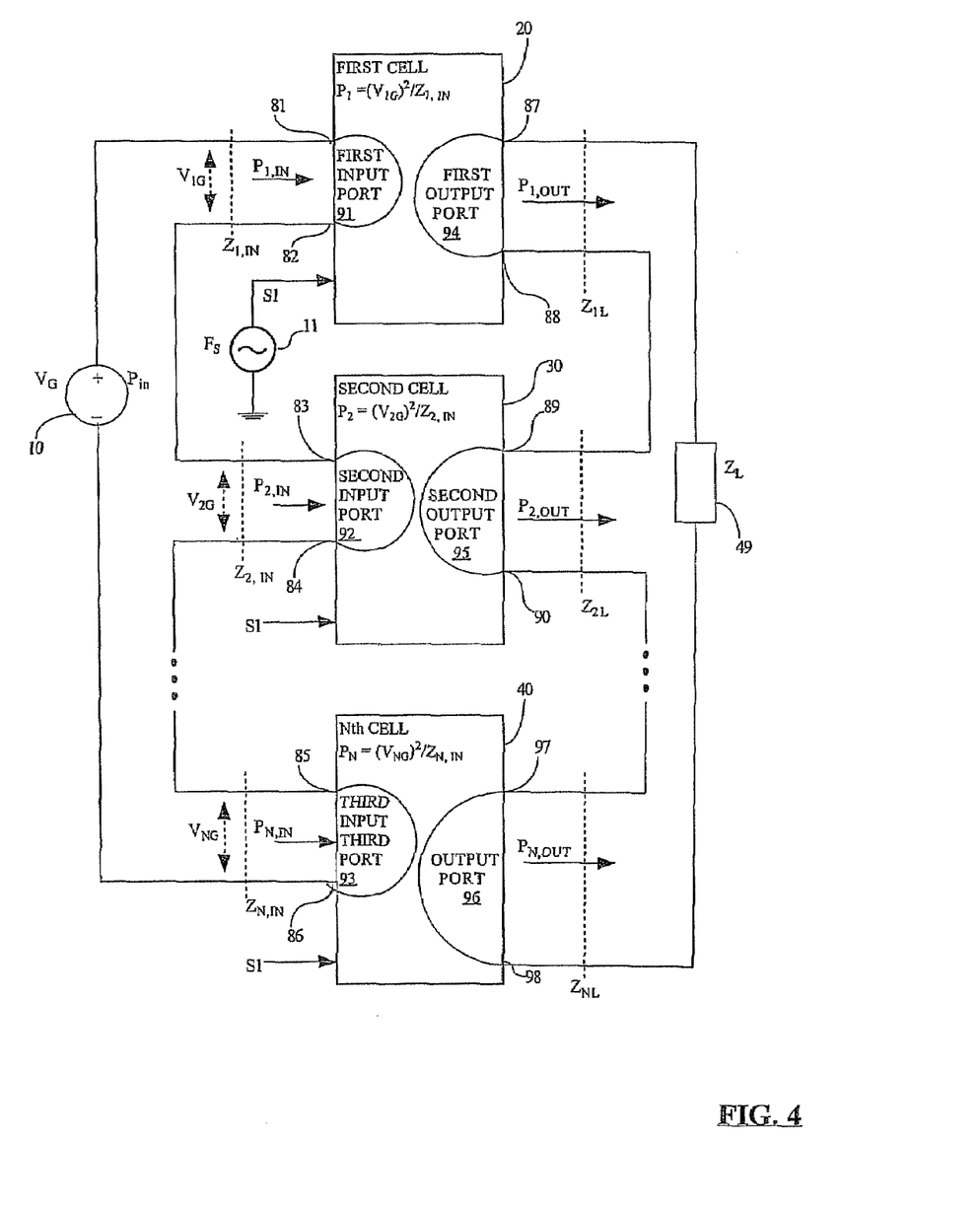
FIG. 4 is a block diagram of an electronic power amplifier constructed in accordance with a second set of illustrative embodiments.

FIG. 4 is a block diagram of an electronic power amplifier constructed in accordance with a second set of illustrative embodiments. The configuration of FIG. 4 is similar to that of FIG. 3, with the exception that each cell 20, 30, and 40 of FIG. 3 is connected to a corresponding load impedance 49, 60, 70, respectively, whereas the outputs of cells 20, 30, and 40 of FIG. 4 are connected in series to a single load impedance 49 denoted as $Z_L$. Referring to FIG. 4, terminal 88 of first output port 94 is connected to terminal 89 of second output port 95. Terminal 90 of second output port 95 is connected to terminal 97 of third output port 96. Load impedance 49 is connected between terminal 87 of first output port 94 and terminal 98 of third output port 96.

When output ports 94, 95, and 96 of cells 20, 30, and 40 are connected in series with each other and with load impedance 49 as in FIG. 4, each cell 20, 30, 40 sees a load impedance $Z_L/N$, assuming use of substantially identical cells 20, 30, 40. Further assume that identical voltage sources are used for $V_G$ 10, and that cell 20 of FIG. 2 is substantially identical to cells 20, 30, and 40 of FIG. 4. In this scenario, the power delivered to load impedance 49 using the multiple-cell configuration of FIG. 4 is substantially the same amount of power that would be delivered to load impedance 49 in the single-cell configuration of FIG. 2.

Figure 5:
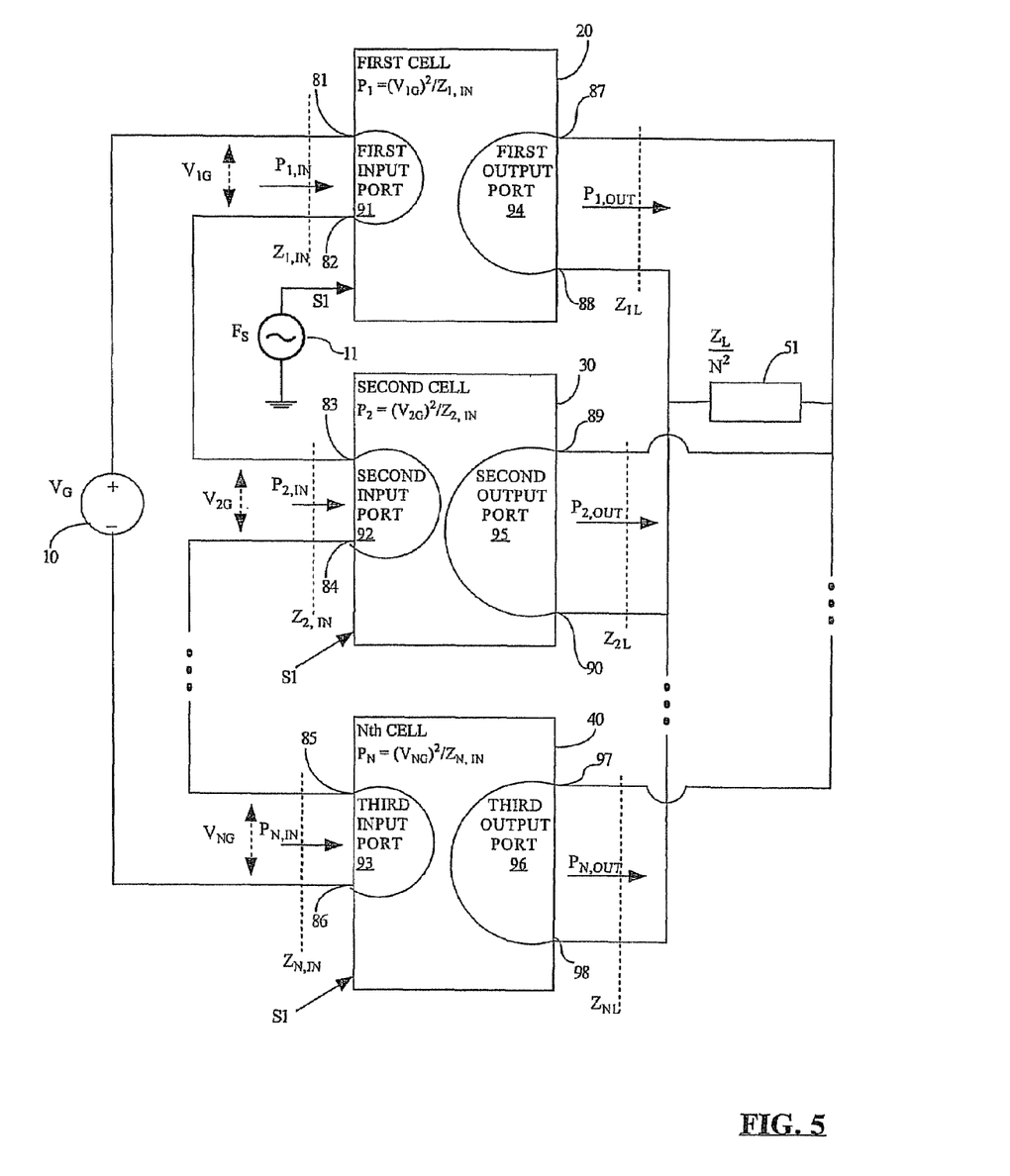
FIG. 5 is a block diagram of an electronic power amplifier constructed in accordance with a third set of illustrative embodiments.

FIG. 5 is a block diagram of an electronic power amplifier constructed in accordance with a third set of illustrative embodiments. The configuration of FIG. 5 is similar to that of FIG. 3, with the exception that each cell 20, 30, and 40 of FIG. 3 is connected to a corresponding load impedance 49, 60, 70, respectively, whereas the outputs of cells 20, 30, and 40 of FIG. 5 are connected in parallel to a single load impedance 51 denoted as $Z_L/N^2$. It is possible to use the system of FIG. 5 in situations where galvanic isolation exists between a respective input port 91, 92, or 93 and a corresponding output port 94, 95, 96 for all cells 20, 30, and 40. Assuming that cells 20, 30, and 40 are substantially identical, then in order for each cell 20, 30, and 40 to see a required load impedance of $Z_L'=Z_L/N$, load impedance 51 should have an impedance of $Z_L/N^2$. Effectively, from the standpoint of electric power conversion, the system of FIG. 5 acts as a transformer with a turns ratio of N. This property is advantageous for systems that utilize low voltage, low impedance loads.

Figure 6:
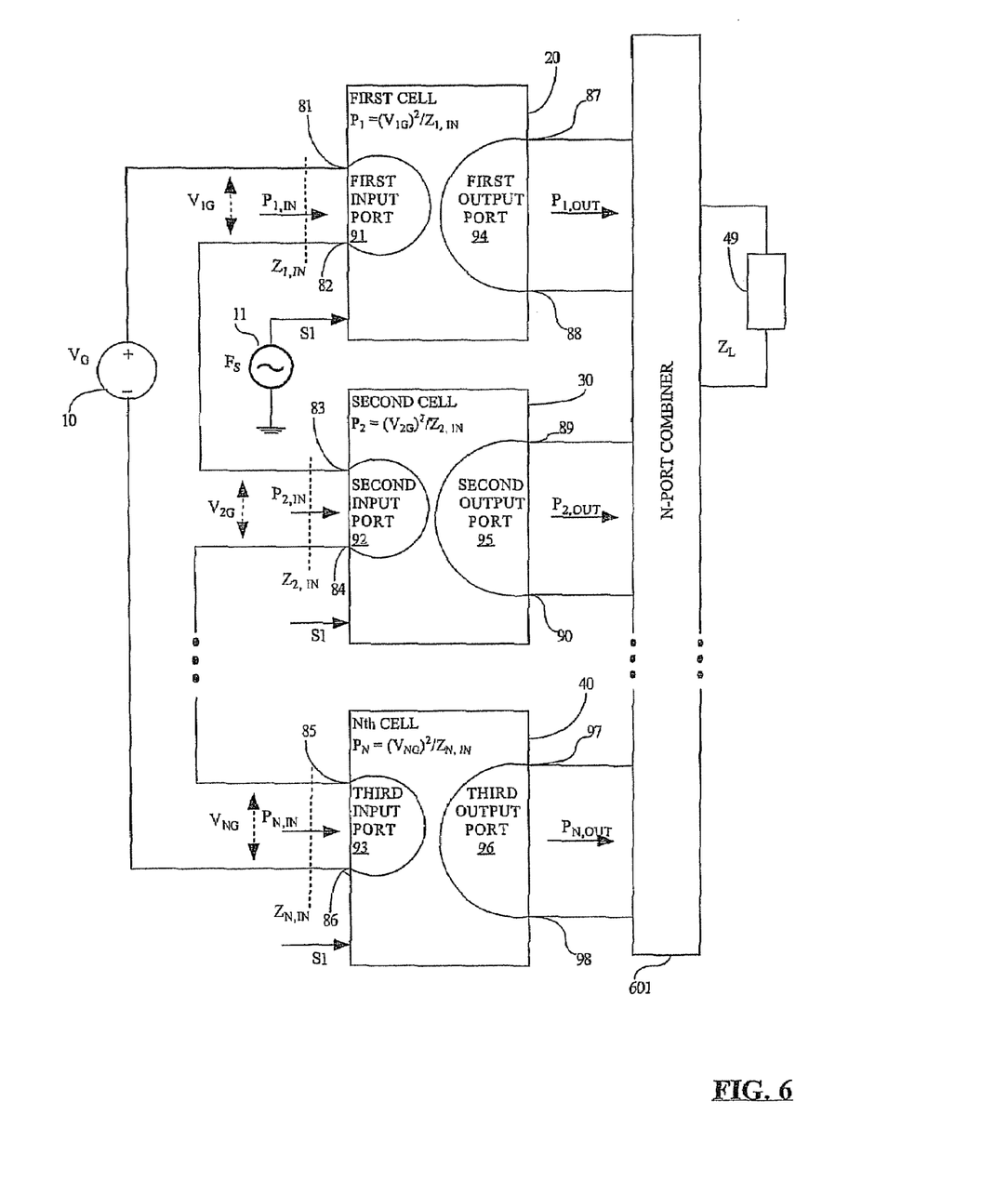
FIG. 6 is a block diagram of an electronic power amplifier constructed in accordance with a fourth set of illustrative embodiments.

FIG. 6 is a block diagram of an electronic power amplifier constructed in accordance with a fourth set of illustrative embodiments. The configuration of FIG. 6 is similar to that of FIG. 3, with the exception that each cell 20, 30, and 40 of FIG. 3 is connected to a corresponding load impedance 49, 60, 70, respectively, whereas the outputs of cells 20, 30, and 40 of FIG. 6 are connected to a power combiner which applies the sum of the cell powers to single load impedance 49 denoted as $Z_L$. It is possible to use the system of FIG. 6 in situations where galvanic isolation exists between a respective input port 91, 92, or 93 and a corresponding output port 94, 95, 96 for all cells 20, 30, and 40. Load impedance 49 will depend on the specific implementation of the combiner.

Pursuant to another set of exemplary embodiments, the series input configurations shown in any of FIGS. 3-5 are applied to cells 20, 30, and 40 that utilize soft-switched transistors. These soft-switched transistors may be operated, for example, in Class E. When soft switching is utilized, a peak active switch voltage $V_{PK}$ appearing across capacitor 26 (FIG. 2) may be several times greater than voltage source $V_G$ 10. First, consider a case where active switch 22 (FIG. 2) is turned off in all N cells 20, 30, 40 (FIGS. 3-5), but voltage source $V_G$ 10 is still connected. In theory, each active switch 22 should see a voltage $V_G/N$, but in practice, small variations in each cell can result in one active switch bearing a greater portion of the input voltage from voltage source $V_G$ 10 than the other active switches. The active switch bearing the greatest portion of this voltage may break down, thereby causing the remaining active switches to break down in quick succession.

In the absence of specialized voltage balancing circuitry, when cell input ports 91, 92, 93 (FIGS. 3-5) are connected in series, each individual active switch that sees the input voltage of a corresponding cell 20, 30, 40 denoted as $V_G'=V_G/N$ must be rated for the total input voltage $V_G$. This rating is necessary because it cannot be guaranteed that the input voltage from voltage source $V_G$ 10 will balance out equally among all active switches when these switches are all off. It is possible to force the voltage to balance evenly when all N cells 20, 30, 40 are all off by using a balancing circuit, but this results in extra power dissipation, complex circuitry, or both. The balancing circuit thus reduces power density and efficiency.

When soft-switched electronic power amplifier topologies such as Class E are utilized because very high switching frequencies are required, it is often the case that the peak active switch voltage $V_{PK}$ will be higher than the DC input voltage from voltage source $V_G$ 10. For a single-cell power converter, $V_{PK}=K*V_G$, where K>1. Then, the breakdown voltage of the active switch ($V_{BR}$) in the single-cell case is greater than or equal to $V_{PK}$. In the case of multiple cells having series-connected inputs, such as any of the configurations shown in FIGS. 3-5, each cell has an active switch with a peak active switch voltage $V'_{PK}=K*V_G/N$. Thus, the required breakdown voltage of each active switch $V'_{BR}$ is greater than or equal to $V'_{PK}$. If one chooses a value of N less than or equal to K, one can reduce the required breakdown voltage of the active switches in each cell 20, 30, 40 by a factor of N without requiring balancing circuitry. This is possible because $V'_{BR}$ is greater than or equal to $V'_{PK}$, which is greater than or equal to $V_G$. Reduction of $V'_{BR}$ for cells 20, 30, and 40 allows use of smaller active switches, or active switches of the same size but lower loss, or both. This design flexibility results in increased power density and efficiency.

Because cell peak voltages $V'_{PK}$ can become quite high when cells 20, 30, and 40 are operating, it is possible to apply any of a variety of passive, lossless balancing techniques to these cells. For example, the addition of capacitors in parallel with one or more input ports 91, 92, 93 of cells 20, 30, 40 may alleviate a tendency for one or more of these cells to become imbalanced. Moreover, if cells 20, 30, and 40 are nearly identical in construction, they will balance reasonably well. For AC outputs, all cells 20, 30, and 40 must run at the same switching frequency. Moreover, all cells 20, 30, and 40 must be synchronized.

The electronic power amplifier systems shown in any of FIGS. 3, 4, 5 and 6 may be used to implement electric power converters having direct current (DC) outputs such as DC-DC converters, by placing a rectifier circuit between the amplifier system and the load or loads. Another method for using electronic power amplifier systems to provide a DC/DC converter is to replace one or more amplifier cells in any of the configurations of FIGS. 1-6 with a DC power converter cell.

Figure 7:
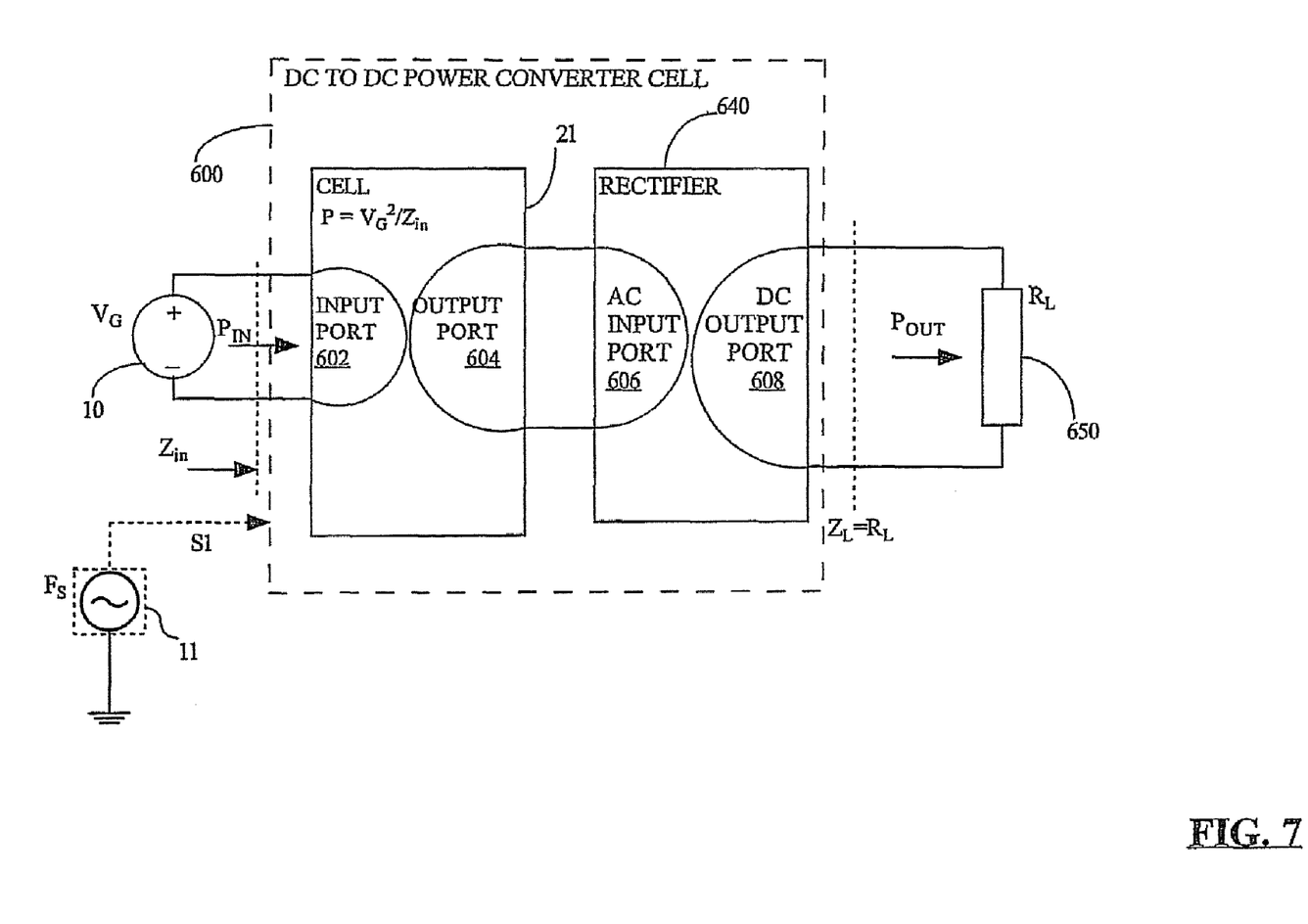
FIG. 7 is a block diagram of a power converter cell for use in any of the configurations shown in FIGS. 4, 5 and 6.

FIG. 7 is a block diagram of a DC power converter cell 600 for use in any of the configurations shown in FIGS. 4 and 5. DC power converter cell 600 is implemented by connecting an AC input port 606 of a rectifier 640 to an output port 604 of a cell 21. Cell 21 may, but need not, be substantially similar to cell 20 of FIG. 2. Cell 21 (FIG. 7) includes an input port 602 having an input impedance $Z_{IN}$ for accepting an input power $P_{IN}$ from voltage source $V_G$ 10, and an optional input signal S1 to control the switch. S1 is optional because the DC-DC converter cell may generate its own internal signal S, and in such a case does not need an external signal. Rectifier 640 has an output port 608 for transmitting power $P_{OUT}$ to a load resistance 650.

Illustratively, DC power converter cell 600 may be used to implement any of cells 20, 30, and 40 shown in FIGS. 4 and 5. In this manner, the outputs of a plurality of rectifiers such as rectifier 640 (FIG. 7) may be combined in series or parallel as described above (FIGS. 4 and 5). If these outputs are combined in series (as in FIG. 4), load resistance 50 (FIG. 7) has a load impedance $Z_L=R_L$. If DC power converter cell 600 is used to implement a plurality N of cells 20, 30, 40 in FIG. 4 or FIG. 5, each of these individual cells can operate at a different $F_S$ and need not be synchronized, because the outputs of all cells are at DC. However, if the individual cells are all operated at the same $F_S$, the phase of each individual cell can be adjusted relative to other cells so as to increase the effective ripple frequency at DC output port 608 (FIG. 6) by a factor of up to N, thereby reducing ripple amplitude. This effect can be used to reduce the output filtering requirements at DC output port 608, and also to gain a further increase in power density.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed as the best or only modes contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. An electronic power amplifier including a plurality of cells, each cell architecture comprising:
   a DC input port for accepting a DC input power from a voltage source $V_G$,
   an AC input port for accepting an AC signal S1 at a frequency $F_S$ and having a first magnitude $M_1$,
   a switching mechanism operatively coupled to the DC input port and to the AC input port for converting the DC input power to an AC output power at the frequency $F_S$ and having a second magnitude $M_2$ greater than the first magnitude $M_1$, and
   an output port capable of applying the AC output power to a load impedance;
   wherein the plurality of cells includes at least a first cell having a first DC input port and a second cell having a second DC input port, and the first and second DC input ports are connected in series for application to the voltage source $V_G$; and further wherein each power amplifier cell includes a reactive component having a capacitive impedance scaled by a factor N equal to the total number of power amplifier cells, such that the electronic power amplifier has a higher power density and a higher efficiency than a single cell electronic power amplifier comprising substantially the same cell architecture and configured to convert the DC input power from the voltage source $V_G$ to an AC output power at the frequency $F_S$.

2. The electronic power amplifier of claim 1 wherein the first cell has a first output port and the second cell has a second output port, and the first output port and the second output port are connected in series for application to the load impedance.

3. The electronic power amplifier of claim 1 wherein the first cell has a first output port and the second cell has a second output port, and the first output port and the second output port are connected in parallel for application to the load impedance.

4. The electronic power amplifier of claim 1 wherein the first cell has a first output port and the second cell has a second output port, and the first output port and the second output port are connected to a power combiner which produces a sum of the output powers for application to the load impedance.

5. The electronic power amplifier of claim 1 wherein the plurality of cells are substantially identical.

6. The electronic power amplifier of claim 5 wherein the plurality of cells includes N cells, N being a positive integer greater than one, each of the plurality of cells having an input impedance $Z_{IN}$, and a total input impedance $Z_{TOTAL}$ is defined as the total impedance applied to the voltage source $V_G$ by the plurality of cells, and the impedance $Z_{IN}$ of each cell is substantially equal to ($Z_{TOTAL}$ divided by N).

7. The electronic power amplifier of claim 5 wherein the plurality of cells includes N cells, N being a positive integer greater than one, and wherein each within of the plurality N of cells includes an active switch having a peak active switch voltage $V'_{PK}$ substantially equal to $K * V_G/N$ where K is a real number greater than one, the active switch having a minimum breakdown voltage $V'_{BR}$ greater than or equal to $V'_{PK}$, and N being selected as less than or equal to K.

8. The electronic power amplifier of claim 7 wherein a breakdown voltage $V_{BR}$ is calculated for a hypothetical electronic power amplifier having only a single cell, and $V_{BR}$ is multiplied by 1/N to obtain the minimum breakdown voltage $V'_{BR}$ for each active switch in the plurality of cells.

9. The electronic power amplifier of claim 5 wherein a capacitive reactance is placed in parallel with a DC input port of each of the plurality of cells to provide load balancing among the plurality of cells.

10. The electronic power amplifier of claim 1 wherein the active switch is capable of implementing soft switched operation.

11. The electronic power amplifier of claim 1 further comprising a rectifier for rectifying the AC output power at the frequency $F_S$ to generate a DC output power, and for applying the DC output power to a load impedance.

12. The electronic power amplifier of claim 1 wherein each cell further comprises a rectifier operatively coupled to the switching mechanism for rectifying the AC output power, thus providing a plurality of cells each capable of converting the DC input power to a DC output power.

13. The electronic power amplifier of claim 12 wherein the first cell has a first output port and the second cell has a second output port, and the first output port and the second output port are connected in series for application to the load impedance.

14. The electronic power amplifier of claim 12 wherein the first cell has a first output port and the second cell has a second output port, and the first output port and the second output port are connected in parallel for application to the load impedance.

15. A method of amplifying an AC input signal of frequency $F_S$ using a plurality of cells, each cell comprising a DC input port for accepting a DC input power from a voltage source $V_G$, an AC input port for accepting an AC signal S1 at a frequency $F_S$ and having a first magnitude $M_1$, a switching mechanism operatively coupled to the DC input port and to the AC input port for converting the DC input power to an AC output power at the frequency $F_S$ and having a second magnitude $M_2$ greater than the first magnitude $M_1$, and an output port capable of applying the AC output power to a load impedance, the plurality of cells including at least a first cell having a first DC input port and a second cell having a second DC input port, wherein each cell architecture includes a reactive component having a capacitive impedance scaled by a factor N equal to the total number of cells, such that an electronic power amplifier comprising the plurality of cells has a higher power density and a higher efficiency than a single cell electronic power amplifier comprising substantially the same cell architecture and configured to convert the DC input power from the voltage source $V_G$ to an AC output power at the frequency $F_S$;
   the method comprising:
      connecting the first and second DC input ports in series, and
      applying the voltage source $V_G$ in series with the series-connected first and second DC input ports.

16. The method of claim 15 wherein the first cell has a first output port and the second cell has a second output port, the method further comprising: connecting the first output port and the second output port in series; and applying the load impedance to the series-connected first and second output ports.

17. The method of claim 15 wherein the first cell has a first output port and the second cell has a second output port, the meted further comprising: connecting the first output port and the second output port in parallel; and applying the load impedance to the parallel-connected first and second output ports.

18. The method of claim 15 wherein the first cell has a first output port and the second cell has a second output port, and the first output port and the second output port are connected to a power combiner which produces a sum of the output powers for application to the load impedance.

19. The method of claim 15 wherein the plurality of cells are substantially identical.

20. The method of claim 19 wherein the plurality of cells includes N cells, N being a positive integer greater than one, each of the plurality of cells having an input impedance $Z_{IN}$, and a total input impedance $Z_{TOTAL}$ is defined as the total impedance applied to the voltage source $V_G$ by the plurality of cells, the method further including constructing each cell to provide an input port impedance $Z_{IN}$ substantially equal to $Z_{TOTAL}$ divided by N.

21. The method of claim 19 further including providing each of the plurality of cells with a reactive circuit element having a first capacitive impedance, and scaling the first capacitive impedance by a factor of approximately N relative to a second capacitive impedance calculated for a hypothetical electronic power amplifier having only a single cell.

22. The method of claim 19 wherein the plurality of cells includes N cells, N being a positive integer greater than one, and wherein each of the plurality of cells includes an active switch having a peak active switch voltage $V'_{PK}$ substantially equal to K * $V_G$/N where K is a real number greater than one, the active switch having a minimum breakdown voltage $V'_{BR}$ greater than or equal to $V'_{PK}$, the method further including selecting N to be less than or equal to K.

23. The method of claim 22 further including calculating a breakdown voltage $V_{BR}$ for a hypothetical electronic power amplifier having only a single cell, and multiplying $V_{BR}$ by approximately 1/N to obtain the minimum breakdown voltage $V'_{BR}$ for each active switch in the plurality of cells.

24. The method of claim 23 further including providing a capacitive reactance in parallel with a DC input port of at least one cell to provide power conversion balancing among the plurality of cells.

25. The method of claim 22 further including the active switch implementing soft switched operation.

26. The method of claim 15 further comprising rectifying the AC output power at the frequency $F_S$ to generate a DC output power, and applying the DC output power to a load impedance.

27. The method of claim 15 further comprising providing each cell with a rectifier operatively coupled to the switching mechanism for rectifying the AC output power, thus providing a plurality of cells each capable of converting the DC input power to a DC output power.

28. The method of claim 27 wherein the first cell has a first output port and the second cell has a second output port, the method further comprising connecting the first output port and the second output port in series for application to the load impedance.

29. The method of claim 27 wherein the first cell has a first output port and the second cell has a second output port, the method further comprising connecting the first output port and the second output port in parallel for application to the load impedance.

* * * * *

UNITED STATES PATENT AND TRADEMARK OFFICE
CERTIFICATE OF CORRECTION

PATENT NO. : 7,576,611 B2  Page 1 of 1
APPLICATION NO. : 11/624774
DATED : August 18, 2009
INVENTOR(S) : Glaser It is certified that error appears in the above-identified patent and that said Letters Patent is hereby corrected as shown below:

In Fig. 4, Sheet 4 of 7, for Tag "93", delete " " and insert -- --, therefor.

In Fig. 4, Sheet 4 of 7, for Tag "96", delete " " and insert -- --, therefor.

In Column 9, Line 60, in claim 7, after "wherein each" delete "within".

In Column 10, Line 64, in claim 17, delete "meted" and insert -- method --, therefor.

Signed and Sealed this

Twenty-third Day of November, 2010

David J. Kappos
*Director of the United States Patent and Trademark Office*